(12) United States Patent
Schuster

(10) Patent No.: US 6,417,974 B1
(45) Date of Patent: Jul. 9, 2002

(54) OBJECTIVE, IN PARTICULAR AN OBJECTIVE FOR A SEMICONDUCTOR LITHOGRAPHY PROJECTION EXPOSURE MACHINE, AND A PRODUCTION METHOD

(76) Inventor: Karl-Heinz Schuster, Rechbergstrasse 24, D-89551 Koenigsbronn (DE)

( * ) Notice: Subject to any disclaimer, the term of this patent is extended or adjusted under 35 U.S.C. 154(b) by 0 days.

(21) Appl. No.: 09/564,444

(22) Filed: May 4, 2000

(30) Foreign Application Priority Data

Jun. 26, 1999 (DE) .......................................... 199 29 403

(51) Int. Cl.⁷ ............................ G02B 9/00; B65D 83/00
(52) U.S. Cl. ...................... 359/754; 359/719; 359/796; 222/402.1
(58) Field of Search ................................ 359/754, 719, 359/796, 797; 355/53; 222/402.1

(56) References Cited

U.S. PATENT DOCUMENTS

| | | | | |
|---|---|---|---|---|
| 4,920,700 A | * | 5/1990 | Murahashi et al. | 51/124 |
| 5,852,490 A | * | 12/1998 | Matsuyama | 355/67 |
| 5,889,617 A | | 3/1999 | Yamada | 359/657 |
| 5,936,782 A | * | 8/1999 | Nomura et al. | 359/719 |
| 6,250,512 B1 | * | 6/2001 | Salamon | 222/402.1 |
| 6,252,712 B1 | * | 6/2001 | Furtet et al. | 359/499 |

FOREIGN PATENT DOCUMENTS

| | | |
|---|---|---|
| EP | 0 347 838 A | 12/1989 |
| EP | 0 857 985 A1 | 8/1998 |
| JP | 05100102 | 4/1993 |
| JP | 06186405 | 10/1994 |

OTHER PUBLICATIONS

U.S. patent application Ser. No. 09/017,159, Schuster, filed Aug. 1998.

* cited by examiner

Primary Examiner—Georgia Epps
Assistant Examiner—Timothy J Thompson
(74) Attorney, Agent, or Firm—Welsh & Katz, Ltd.

(57) ABSTRACT

In the case of an objective (10), in particular of an objective for a semiconductor lithography projection exposure machine, having a plurality of optical elements supported in mounts, the last optical element (1) in the beam direction is connected directly to the penultimate optical element (2) in a mount-free and exchangeable fashion. The connection can be performed by wringing a thin equidistant plate as last optical element (1).

18 Claims, 1 Drawing Sheet

OBJECTIVE, IN PARTICULAR AN OBJECTIVE FOR A SEMICONDUCTOR LITHOGRAPHY PROJECTION EXPOSURE MACHINE, AND A PRODUCTION METHOD

The invention relates to an objective, in particular an objective for a semiconductor lithography projection exposure machine, having a plurality of optical elements supported in mounts. The invention also relates to a method for producing an optical element.

The resists used in lithography are being increasingly loaded with higher pulse powers and pulse numbers of a laser. Resists generally consist of plastic and are changed upon the application of laser light, in which case they output emissions which are damaging to the optical elements of the objective used in the semiconductor lithography projection exposure machine. This holds, in particular, for the optical terminal surfaces which in this way lose their capacity for use in the course of time.

It is therefore known to subject the objective to a specific overpressure, gas being introduced continuously for this purpose, in order to keep the optics clean at all times. This prevents contaminants from penetrating inwards from the outside, because a slight overpressure always prevails in the interior of the objective. On the side directed toward the resist, the objective is provided with a terminal plate which forms a protection against contaminants from the resist and simultaneously also seals the objective.

With increasing aperture and more stringent wavefront requirements of recent systems in lithography, the downstream plane-parallel terminal plates are becoming increasingly problematic. A relatively large aperture in conjunction with an unchanged image field necessarily increases the plate diameter and consequently, given the same thickness, the sagging due to gravity, for example. However, a specific amount of sagging worsens the wavefront substantially in the case of a higher aperture. Although a thicker terminal plate could remedy this, this not only increases the dead weight of the objective, but can moreover also lead to heating up and to image quality problems resulting therefrom.

Because of the abovenamed disadvantages in the use of a terminal plate, an attempt is made in part to dispense entirely with the terminal plate. This is no problem with reference to the optical design of a lithography objective. However, if the last optical element, be this a lens or else the terminal plate, becomes useless, for example because of contaminants from the resist, the entire objective must be sent back to the optical company or to the manufacturer, where a new lens must be produced and the entire optical system must be readjusted and tuned. The errors which, to be specific, are introduced by a new lens and/or terminal plate are generally so large that it is impossible to dispense with renewed tuning. The new lens and/or the terminal place necessarily have homogeneity and surface imperfections and, in the case of a lens, also an offset and centering errors, to which are added mechanical restraints imposed by the mount in which the lens is embedded.

It is therefore the object of the present invention to avoid the abovenamed disadvantages, in particular to create an objective in which the last optical element which is particularly at risk from damage and contaminants can easily be exchanged if required.

This object is achieved according to the invention by means of the features named in the characterizing part of claim 1.

By virtue of the fact that the last optical element is connected directly to the penultimate optical element in a mount-free fashion, no renewed tuning is required in the event of its exchange. This means it is no longer necessary to return it to the manufacturer. A person skilled in the art who has a suitable optical element in store can, if required, exchange the damaged last optical element directly in situ. This can be done, for example, without difficulty and in a short time in a clean environment in a clean room directly on the objective because of the exchangeable and/or detachable connection of the last optical element to the penultimate optical element.

When, in a very advantageous development of the invention, it is provided that the last optical element is constructed as a thin equidistant plate, any sort of setting or tuning work can then be eliminated, because optically it is no longer important how accurately the equidistant plate is seated to the side, or how accurately it is centered, since it is of the same thickness (curved or flat) at every point.

A further very advantageous refinement of the invention can consist in that the last optical element is connected to the penultimate optical element by wringing. A simple connection, mount-free and exchangeable, of the last optical element to the penultimate optical element is thereby achieved. In this case, the two optical elements are juxtaposed without a clearance, which is referred to in joining technology as "wringing" or "physical glue". In wringing, use is made of the atomic forces at very short distances.

When using a last optical element made from crystalline material, it is advantageous to apply an amorphous inorganic layer, for example silica glass, to the side facing the penultimate optical element. Although it is also possible in principle for an optical element made from crystalline material to be wrung, because the crystals such as calcium fluoride or potassium fluoride, have only a relatively slight long range action to the outside with reference to their atomic forces, the application of an amorphous inorganic layer, for example vapor deposition, has the effect that during this vapor deposition, the atoms of silicon oxide, for example, penetrate in the vacuum into the crystal structure, the result being better adhesion.

The last optical element can be provided as the known terminal plate or, instead of a separate terminal plate, so can the last optical element, specifically the last lens of the objective. In the latter case, this actually means that the last lens is now of bipartite construction, the outer part being very thin by comparison with the inner part in one refinement of the invention, and the mount-free connection is situated between the outer part and the inner part of the lens. In other words, the inner part of the lens is held in a known way in a mount, while the outer part of the lens is connected to the inner part of the lens in a mount-free and exchangeable fashion. In this case, the known terminal plate is omitted without replacement.

An advantageous method for producing the last optical element is described in claim 14.

A thin wafer or equidistant plate is generally provided as the last optical element. The production of such a thin wafer with an appropriate accuracy and/or with avoidance of material defects is, however, a problem and/or such a plate must be appropriately accurate so that it can be used in situ instead of the damaged optical element in the way according to the invention without changing the optical properties of the objective. This can also be achieved in a relatively simple way using the method according to the invention. This is rendered possible, in particular, by the processing on an adapter whose values are known, for which reason the average values of the wafer or plate to be processed on the adapter, which is later to be used as a new optical element, can be matched as appropriate to the requirements by processing the surfaces.

Further advantageous refinements of the objective follow from the remaining subclaims and the exemplary embodiment described below in principle with the aid of the drawing, in which:

Figure 1:
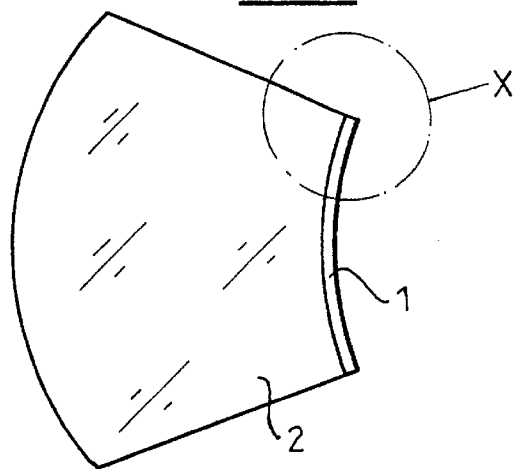
FIG. 1 shows a last lens of an objective having an equidistant optical plate wrung thereon.
Figure 6:
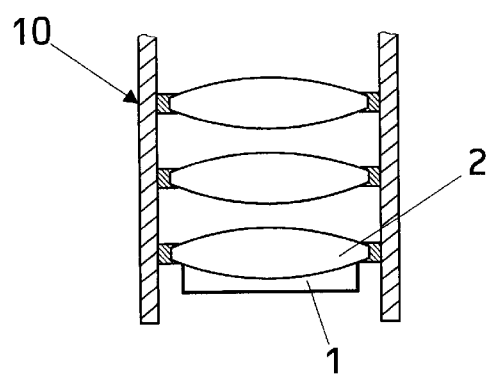
FIG. 6 shows an objective with a plurality of lenses.

As may be seen from FIG. 1, the last optical element 1 of an objective 10, which is represented in FIG. 6 only in principle and in a simplified way and which is provided with a plurality of lenses, supported in mounts, as optical elements, is held in a semiconductor lithography projection exposure machine without a mount directly on the optical element 2, which is now the penultimate one, of the objective 10. The connection is performed by so-called wringing, that is to say the two optical elements 1 and 2 bear directly against one another without a clearance. When the lens 2 consists of crystalline material, for example a fluoride such as $CaF_2$, $MgF_2$ or NaF, a thin layer 3 made for amorphous inorganic material such as silica glass ($SiO_2$), is applied to a wringing surface 4 of the lens 2 in order to improve the wringing. The thin layer 3 can be applied using known techniques such as sputtering of $SiO_2$ onto $MgF_2$, which produces a layer which adheres well and has a good smoothing effect.

The thin layer 3 can also comprise the same material, but in amorphous form, as the lens 2, in which case the adhesion is certainly not improved, of course, but the smoothing is effective.

Figure 2:
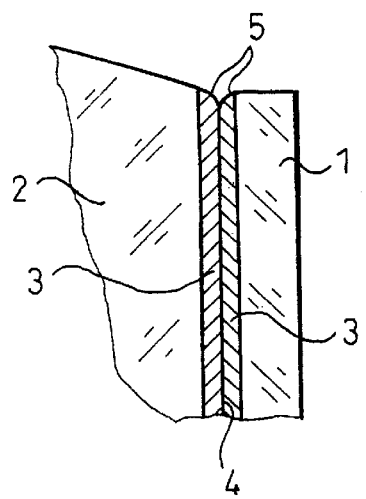
FIG. 2 shows an enlarged illustration of the dashed and dotted circle X in FIG. 1, with coating surfaces between the lens and an optical plate as the last optical element.

FIG. 2 shows in an enlarged illustration corresponding to the circle X according to FIG. 1 a wringing of two optical elements 1 and 2 in which the two optical elements 1 and 2 consist of a crystal. In this case, both optical elements are provided with a vapor deposition of $SiO_2$ or $Al_2O_3$ on the wringing surface 4.

Figure 3:
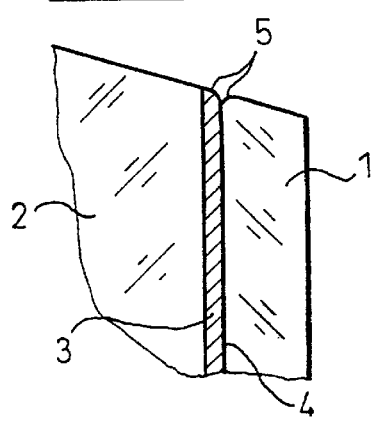
FIG. 3 shows an enlarged illustration of the dashed and dotted circle X in FIG. 1, with coating surfaces between the lens and an optical plate with a bipartite lens as the last optical element.

FIG. 3 shows a similar refinement in an enlarged illustration, only a vapor deposition of the optical element 2, specifically the lens having been undertaken on the wringing surface 4.

It may also be seen from the two enlarged illustrations in FIGS. 2 and 3 that the two optical elements 1 and 2 are provided on the wringing surface 4 with a round-polished edge 5 in each case. Of course, it may also be sufficient to round-polish only one of the two edges. The round-polished edge 5 or the round-polished edges 5 serve as wringing aid in an exchange of the last optical element 1 on the basis of wear and/or damage by a downstream resist.

The last optical element 1 is provided in the usual way with an antireflecting layer on the side facing the resist.

The last optical element 1 can be a terminal plate or else a lens which has been "severed" from the last lens 2 as a thinner outer part. In other words, in this case the last lens of the objective 10 is of bipartite construction with an inner part and an outer part, the essentially thinner outer part being connected with the inner part of the lens in a mount-free fashion and by wringing.

In order further to increase the durability of the wringing in operation, it is also possible to provide the last optical element 1 or the terminal plate with a slightly flatter radius or flatter arcuate curve than the penultimate optical element 2 on the wringing surface 4. Identical radii are then present after the wringing. However, the wrung element, specifically the last optical element 1, exerts a little pressure on the wringing edge through slight bending forces. Since wringings generally detach themselves from the middle, the durability of the wringing can be further improved in this way.

Figure 4:
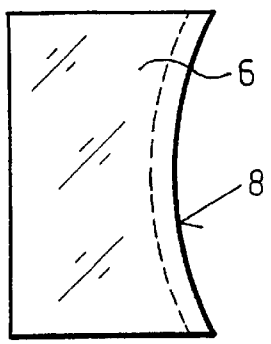
FIG. 4 shows a base body from which a thin wafer or plate is severed.
Figure 5:
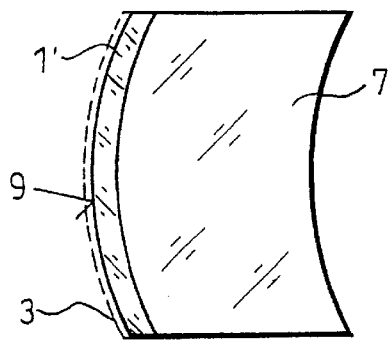
FIG. 5 shows an arrangement of a thin wafer or plate as the last optical element on an adapter for the purpose of processing.

A possible form of production of the last optical element 1 is described below with the aid of FIGS. 4 and 5.

An optical surface 8 is processed, specifically in accordance with the requirements of being flat or having a radius, on a relatively thick optical material as base piece 6. This optical surface 8 is provided with an adhesive layer, for example $SiO_2$, if appropriate. Subsequently, a thin wafer or plate is sawed off from the base piece 6, for example using a diamond saw. The equidistant wafer or plate 1' is wrung onto an adapter 7 of very good homogeneity with very good surfaces. The optical surface 9 of the plate 1', which is situated opposite the previously processed optical surface 8 and which comes to bear against the later wringing surface 4 is then processed on the adapter 7.

The adapter 7 itself is known very accurately interferometrically in continuous operation. The optical surface 9 facing the later wringing surface is now fabricated in accordance with the requirements while monitoring the surface, and finally monitoring the passage. This can be performed, for example, by robot polishing/ion beam polishing. When monitoring the plate 1', the wavefront of the adapter 7 is subtracted, as a result of which the passage of the thin plate 1"is left over. Thin plate 1' means a thickness of approximately 0.5 to 1 mm here. All the influences such as vapor deposition, layer thickness variation (adhesive layer, homogeneity, imperfections in the surface 8 firstly processed on the base piece 6 are detected and integrally measured and can be eliminated appropriately.

A damaged optical element of an objective 10 can be replaced simply and quickly with the aid of such a plate as optical element 1. It is conceivable for the works to supply one or more such replacement plates 1 as accessories as early as when supplying an objective 10. It is then possible in this way to provide the objective 10, even at the works, with a plurality of replacement plates as a qualified scope of delivery.

What is claimed is:

1. An objective having a plurality of optical elements supported in mounts, wherein the last optical element in the beam direction has a layer of crystalline material and a layer of amorphous inorganic material and is connected directly to the penultimate optical element in a mount-free and exchangeable fashion.

2. The objective as claimed in claim 1, wherein the last optical element is constructed as a thin equidistant plate in a bent or flat shape.

3. The objective as claimed in claim 1, wherein the last optical element is connected to the penultimate optical element by wringing.

4. The objective as claimed in claim 3, wherein at least one of the two optical elements is provided with a round-polished edge on the wringing surface.

5. The objective as claimed in claim 3, wherein the radius of the last optical element is slightly flatter than the radius of the penultimate optical element on the wringing surface.

6. The objective as claimed in claim 1, wherein the last optical element is a terminal place.

7. The objective as claimed in claim 1, wherein the last optical element is a lens.

8. The objective as claimed in claim 7, wherein the lens is of bipartite construction, the outer part being very thin by comparison with the inner part, and the mount-Free connection being situated between the outer part and the inner part of the lens.

9. The objective as claimed in claim 1, wherein the case of the use of a last optical element made from crystalline material, an amorphous inorganic layer is applied to the side facing the penultimate optical element.

10. The objective as claimed in claim 1, wherein in the case of the use of a penultimate and a last optical element made of crystalline material or in the case of a bipartite lens as the last optical elements are provided on the wringing surface with an amorphous inorganic layer in each case.

11. The objective as claimed in claim 9, wherein the crystalline material is a fluoride.

12. The objective as claimed in claim 9, wherein the amorphous inorganic layer is an oxidic layer.

13. The objective as claimed in claim 12, wherein the oxidic layer consists of silica glass.

14. A method for producing a thin optical element made from crystalline material as the last optical element of an objective, comprising an objective for a semiconductor lithography projection exposure machine, with a slight thickness of less than 5 mm, wherein a surface on a blank is processed to final shape, a thin wafer is subsequently severed from the blank, the wafer is connected to an adapter, whereafter the surface of the wafer opposite the previously processed surface is subsequently processed.

15. The method as claimed in claim 14, wherein the thin wafer is connected to the adapter by wringing.

16. The method as claimed in claim 14, wherein the last processed surface of the wafer is coated with amorphous organic layer.

17. An objective for a semiconductor lithography projection exposure machine, having a plurality of optical elements supported in mounts, wherein the last optical element in the beam direction is connected directly to the penultimate optical element in a mount-free and exchangeable fashion, and the last optical element is a terminal place.

18. An objective for a semiconductor lithography projection exposure machine, having a plurality of optical elements supported in mounts, wherein the last optical element in the beam direction is connected directly to the penultimate optical element in a mount-free and exchangeable fashion, and the last optical element is a made from crystalline material, with an amorphous inorganic layer applied to the side facing the penultimate optical element.

* * * * *

UNITED STATES PATENT AND TRADEMARK OFFICE
CERTIFICATE OF CORRECTION

PATENT NO. : 6,417,974 B1
DATED : July 9, 2002
INVENTOR(S) : Schuster

It is certified that error appears in the above-identified patent and that said Letters Patent is hereby corrected as shown below:

Column 4,
Line 35, "thin plate 1''" should be -- thin plate 1' --;
Line 37, "layer thickness variation (adhesive layer, homogeneity" should be -- layer thickness variation (adhesive layer), homogeneity --;

Column 5,
Line 2, "a terminal place" should be -- a terminal plate --;

Column 6,
Line 23, "is a made" should be -- is made --.

Signed and Sealed this

Twenty-eighth Day of January, 2003

JAMES E. ROGAN
*Director of the United States Patent and Trademark Office*